(12) United States Patent
Rupprich et al.

(10) Patent No.: US 11,081,520 B2
(45) Date of Patent: Aug. 3, 2021

(54) LUMINESCENCE DIODE WITH FIRST AND SECOND LAYER SEQUENCES HAVING AN ARRANGEMENT OF MICROPRISMS AND METHOD FOR PRODUCING THE SAME

(71) Applicant: OSRAM Opto Semiconductors GmbH, Regensburg (DE)

(72) Inventors: Christoph Rupprich, Maxhütte-Haidhof (DE); Andreas Rudolph, Regensburg (DE); Hubert Halbritter, Dietfurt (DE)

(73) Assignee: OSRAM OLED GMBH, Regensburg (DE)

( * ) Notice: Subject to any disclaimer, the term of this patent is extended or adjusted under 35 U.S.C. 154(b) by 27 days.

(21) Appl. No.: 16/310,778

(22) PCT Filed: Jul. 3, 2017

(86) PCT No.: PCT/EP2017/066505
§ 371 (c)(1),
(2) Date: Dec. 17, 2018

(87) PCT Pub. No.: WO2018/007320
PCT Pub. Date: Jan. 11, 2018

(65) Prior Publication Data
US 2020/0119084 A1    Apr. 16, 2020

(30) Foreign Application Priority Data
Jul. 7, 2016    (DE) .......................... 102016112502.4

(51) Int. Cl.
*H01L 33/00*    (2010.01)
*H01L 27/15*    (2006.01)
(Continued)

(52) U.S. Cl.
CPC .......... *H01L 27/15* (2013.01); *H01L 33/0062* (2013.01); *H01L 33/0093* (2020.05);
(Continued)

(58) Field of Classification Search
CPC ............................... H01L 27/15; H01L 33/08
See application file for complete search history.

(56) References Cited

U.S. PATENT DOCUMENTS 8,624,269 B2    1/2014  Wirth
2014/0217460 A1*  8/2014  Tangring ................ H01L 33/62
                                                        257/99
(Continued)

FOREIGN PATENT DOCUMENTS

DE    102008021620 A1    11/2009
DE    102011010503 A1     8/2012
WO       2009132614 A1    11/2009

*Primary Examiner* — Suberr L Chi
(74) *Attorney, Agent, or Firm* — Slater Matsil, LLP

(57) ABSTRACT

A luminescence diode and a method for producing a luminescence diode are disclosed. In an embodiment a luminescence diode includes a carrier substrate, a first semiconductor layer sequence including a first active layer suitable for emitting radiation having a first dominant wavelength $\lambda_{dom1}$ and a second semiconductor layer sequence including a second active layer suitable for emitting radiation having a second dominant wavelength $\lambda_{dom2}$, wherein the first semiconductor layer sequence and the second semiconductor layer sequence are arranged side by side on the carrier substrate, and wherein the first dominant wavelength $\lambda_{dom1}$ of the first active layer and the second dominant wavelength $\lambda_{dom2}$ of the second active layer are different from each other.

8 Claims, 8 Drawing Sheets

(51) Int. Cl.
   *H01L 33/24* (2010.01)
   *H01L 33/30* (2010.01)
   *H01L 33/62* (2010.01)

(52) U.S. Cl.
   CPC .............. *H01L 33/24* (2013.01); *H01L 33/30* (2013.01); *H01L 33/62* (2013.01); *H01L 2933/0066* (2013.01)

(56) References Cited

U.S. PATENT DOCUMENTS

| | | |
|---|---|---|
| 2016/0005921 A1 | 1/2016 | Suchalkin et al. |
| 2017/0025566 A1* | 1/2017 | Song ........................ H01L 33/62 |
| 2017/0025567 A1* | 1/2017 | Lu .......................... H01L 27/153 |

* cited by examiner

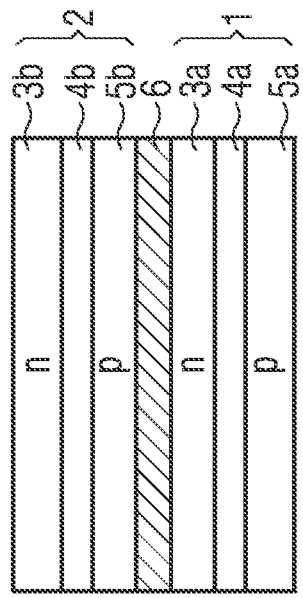
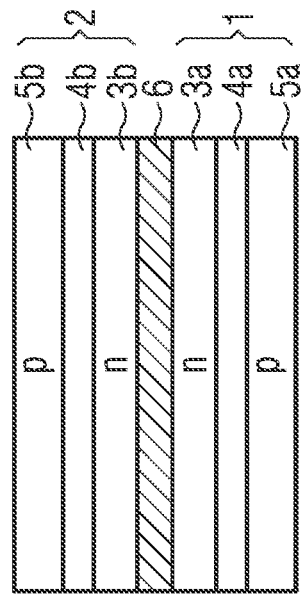
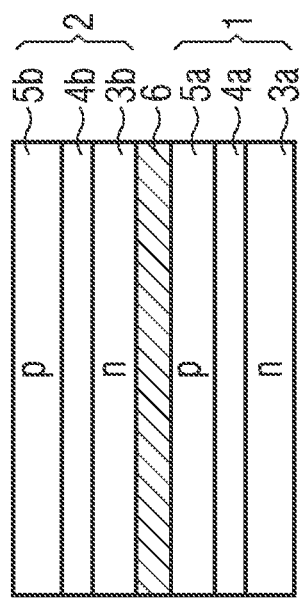
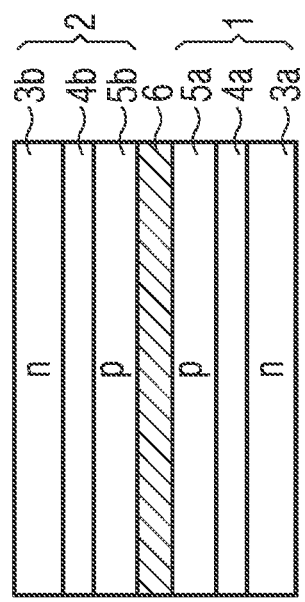

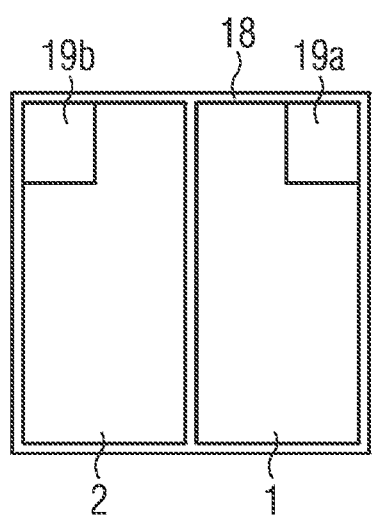
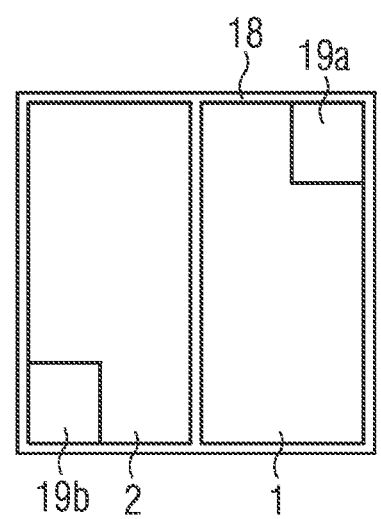
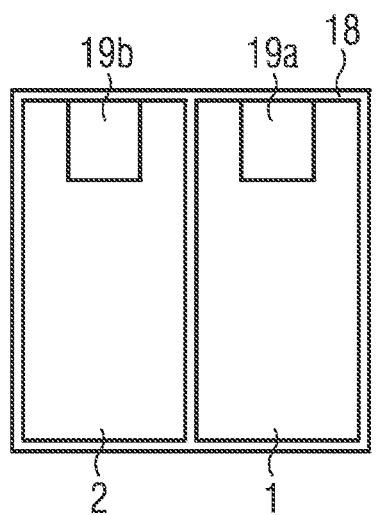
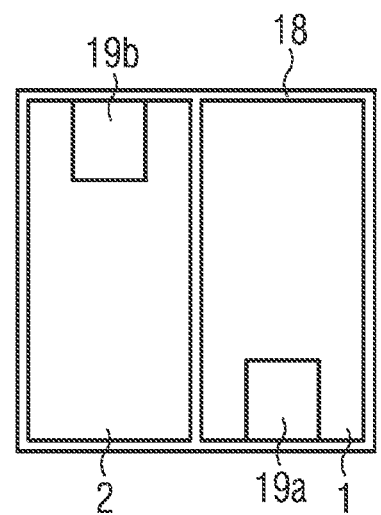

LUMINESCENCE DIODE WITH FIRST AND SECOND LAYER SEQUENCES HAVING AN ARRANGEMENT OF MICROPRISMS AND METHOD FOR PRODUCING THE SAME

This patent application is a national phase filing under section 371 of PCT/EP2017/066505, filed Jul. 3, 2017, which claims the priority of German patent application 102016112502.4, filed Jul. 7, 2016, each of which is incorporated herein by reference in its entirety.

TECHNICAL FIELD

The application concerns a luminescence diode intended in particular for emission in the infrared spectral range and a process producing the luminescence diode.

SUMMARY OF THE INVENTION

Embodiments provide a luminescence diode which emits radiation in a wide wavelength range. Further embodiments provide a process suitable for producing a luminescence diode.

Embodiments provide a luminescence diode for the emission of radiation in the infrared spectral range. In particular, the luminescence diode may be provided for the emission of radiation in the wavelength range between about 780 nm and about 1100 nm. In this configuration, the luminescence diode emits in the near infrared spectral range (NIR).

Embodiments provide a luminescence diode advantageously comprising a carrier substrate on which a first semiconductor layer sequence and a second semiconductor layer sequence are arranged next to each other. In other words, the first semiconductor layer sequence and the second semiconductor layer sequence are arranged offset laterally to each other on the carrier substrate. Preferably, the first semiconductor layer sequence and the second semiconductor layer sequence do not overlap in the lateral direction.

The first semiconductor layer sequence has a first active layer that is suitable for emitting radiation with a first dominant wavelength $\lambda_{dom1}$. The second semiconductor layer sequence has a second active layer that is suitable for emitting radiation with a second dominant wavelength $\lambda_{dom2}$. The dominant wavelength $\lambda_{dom1}$ of the first active layer and the dominant wavelength $\lambda_{dom2}$ of the second active layer are advantageously different.

By the fact that in the luminescence diode the semiconductor layer sequences with the first active layer and the second active layer, which emit different wavelengths, are arranged side by side on the carrier substrate, a broadband emission spectrum is advantageously achieved in the far field of the luminescence diode which contains the radiation of both active layers. Due to the arrangement on the common carrier substrate, the active layers are spatially close to each other, so that the radiation in the far field of the luminescence diode is advantageously homogeneous. Compared to the realization of a broadband radiation by separately arranged individual luminescence diodes, the luminescence diode described here is particularly space-saving and cost-effective.

The first active layer and the second active layer each preferably comprise an arsenide compound semiconductor material or an arsenide-phosphide compound semiconductor material. In particular, the active layers may have $Al_xIn_yGa_{1-x-y}As$ with $0 \leq x \leq 1$, $0 \leq y \leq 1$ and $x+y \leq 1$ or $Al_xIn_yGa_{1-x-y}As_nP_{1-n}$ with $0 \leq x \leq 1$, $0 \leq y \leq 1$ and $x+y \leq 1$ and $0 \leq n \leq 1$, wherein the first active layer and the second active layer differ in material composition. By selecting the material composition for the first active layer and the second active layer, the dominant wavelengths $\lambda_{dom1}$, $\lambda_{dom2}$ in particular can be specifically adjusted. Preferably 780 nm$\leq \lambda_{dom1}$, $\lambda_{dom2} \leq 1100$ nm holds true with $\lambda_{dom1} \neq \lambda_{dom2}$.

According to an embodiment of the luminescence diode, the first semiconductor layer sequence and the second semiconductor layer sequence are arranged offset to each other in the vertical direction. The first semiconductor layer sequence and the second semiconductor layer sequence are thus laterally and vertically offset. In particular, the first semiconductor layer sequence and the second semiconductor layer sequence have different vertical distances to the carrier substrate. The different vertical distance of the semiconductor layer sequences to the carrier substrate can result from the manufacturing process of the luminescence diode described in more detail below, in which the semiconductor layer sequences are deposited advantageously on top of each other.

The first and second semiconductor layer sequences are preferably connected to the carrier substrate by means of a bonding layer, in particular a solder layer. In particular, the carrier substrate is not the same as the growth substrate of the semiconductor layer sequences, but is advantageously connected to them only after the semiconductor layer sequences have been produced. The carrier substrate does not therefore have to be suitable for epitaxial growth of the semiconductor layer sequences, but can rather be selected according to its mechanical and/or thermal properties, in particular thermal conductivity or coefficient of thermal expansion. For example, the carrier substrate may contain a semiconductor material such as silicon or germanium, or a metal or a metal alloy.

A solder layer, which connects the semiconductor layer sequence with the carrier substrate, advantageously compensates the different distances of the semiconductor layer sequences from the carrier substrate. For example, the solder layer is thicker in an area between the carrier substrate and the semiconductor layer sequence with the greater distance to the carrier substrate than in an area between the carrier substrate and the semiconductor layer sequence with the smaller distance to the carrier substrate.

The first semiconductor layer sequence and the second semiconductor layer sequence can be electrically interconnected, especially by the solder layer. The solder layer can, for example, establish an electrical connection to a contact of the semiconductor layer sequences which faces the carrier substrate.

In accordance with an advantageous embodiment, the semiconductor layer sequences are electrically contacted on a side facing away from the carrier substrate by a common bond pad. In this case, the common bond pad can span a gap between the semiconductor layer sequences. In this case, the gap can be advantageously filled with an electrical insulating material.

The first semiconductor layer sequence and the second semiconductor layer sequence are preferably connected in parallel in the luminescence diode. Thus both active layers emit light simultaneously when the luminescent diode is in operation, without having to be electrically connected separately. Parallel connection can be achieved in particular by the semiconductor layer sequences having a common contact layer or at least electrically interconnected contact layers both on the side facing the carrier substrate and on the side facing away from the carrier substrate.

In accordance with a further advantageous embodiment, both the first semiconductor layer sequence and the second semiconductor layer sequence each have an arrangement of microprisms, the microprisms extending into the semiconductor layer sequences starting from a first main surface of the semiconductor layer sequences facing away from the carrier substrate. Preferably, a cross-section of the microprisms decreases in a vertical direction starting from the first main surface.

Furthermore, a method for producing a luminescence diode, in particular a luminescence diode for the infrared spectral range, is specified. According to at least one embodiment, a first semiconductor layer sequence comprising a first active layer suitable for emitting radiation with a first dominant wavelength $\lambda_{dom1}$ is grown on a growth substrate. The growth is carried out in particular by an epitaxial process such as metal-organic vapor deposition (MOVPE).

In a further process step, a second semiconductor layer sequence, which has a second active layer suitable for emitting radiation with a second dominant wavelength $\lambda_{dom2}$, is advantageously grown over the first semiconductor layer sequence. As in the case of the first semiconductor layer sequence, growth is carried out in particular by an epitaxial process such as metal-organic vapor deposition (MOVPE).

Subsequently, the second semiconductor layer sequence is removed in a first region of the first semiconductor layer sequence. This can be done photolithographically by applying a mask layer and a subsequent etching process. The first region is preferably about half as large as the total area of the second semiconductor layer sequence. For example, the first region can have an area proportion between 30% and 70% or preferably between 40% and 60% of the total area of the second semiconductor layer sequence. The brightness generated by the luminescent diode may depend on the wavelength emitted. The brightness of $\lambda_{dom1}$ and $\lambda_{dom2}$ can be adjusted for a more homogeneous light image by adjusting the respective area proportions.

In a subsequent method step, the semiconductor layer sequences are advantageously bonded to a carrier substrate on a side facing away from the growth substrate. This can be done in particular by means of a solder layer which preferably compensates for a vertical distance between the surfaces of the first semiconductor layer sequence facing away from the growth substrate and the second semiconductor layer sequence. In particular, the solder layer may have a greater thickness in the first region where the second semiconductor layer sequence has been removed than in a second region where the second semiconductor layer sequence has not been removed from the semiconductor layer sequence. In other words, the solder layer connects the carrier substrate, which in particular has a flat surface, with a stepped surface formed by the adjacent semiconductor layer sequences.

In a further method step, the growth substrate is removed from the semiconductor layer sequences. This can be done, for example, by an etching process, by a mechanical process such as grinding, or by a combination of such processes. By removing the growth substrate, the first semiconductor layer sequence is advantageously exposed on the surface originally facing the growth substrate. The exposure of the first semiconductor layer sequence by removing the growth substrate makes it possible, in particular, to partially remove the first semiconductor layer sequence in a subsequent method step.

In particular, the first semiconductor layer sequence in a second region laterally offset from the first region is removed after removal of the growth substrate. In particular, the second region may be complementary to the first region, i.e., the first semiconductor layer sequence is preferably removed outside the first region where the second semiconductor layer sequence was previously removed. After partially removing the first semiconductor layer sequence, the carrier substrate advantageously has a first region in which only the first semiconductor layer sequence is present and a laterally offset second region in which only the second semiconductor layer sequence is present. Partial removal of the first semiconductor layer sequence, like the previous partial removal of the second semiconductor layer sequence, can be accomplished by, for example, photolithographically applying a mask layer and then etching.

In an advantageous embodiment of the method, an etch stop layer is applied to the first semiconductor layer sequence before the second semiconductor layer sequence is grown. In this case, the etch stop layer is located at the interface between the first semiconductor layer sequence and the second semiconductor layer sequence. The etch stop layer has the advantage that when partially removing the second semiconductor layer sequence, the first semiconductor layer sequence is essentially not attacked, and when subsequently partially removing the first semiconductor layer sequence, the second semiconductor layer sequence is essentially not attacked.

In an embodiment of the method, the first semiconductor layer sequence and the second semiconductor layer sequence are each advantageously based on an arsenide compound semiconductor. In this case it is advantageous if the etch stop layer contains a phosphide compound semiconductor material. The etch stop layer may contain InGaP in particular.

In another advantageous embodiment, microprisms are produced both in the first semiconductor layer sequence and in the second semiconductor layer sequence prior to bonding the semiconductor layer sequences to the carrier substrate, wherein the microprisms extend into the semiconductor layer sequences starting from a first main surface of the semiconductor layer sequences facing away from the growth substrate, and wherein a cross-section of the microprisms decreases starting from the first main surface. The arrangement of the microprisms in the semiconductor layer sequences can advantageously limit the current spreading on the p-side of the semiconductor layer sequence, improve the radiation decoupling and homogenize the radiation. In particular, microprisms can have the function of keeping positive charge carriers (holes) away from areas of the semiconductor layer sequence in which contact layers such as bond pads or contact bars for electrical contacting are applied. If the holes below the contact layers were recombined, the emitted light would otherwise be absorbed in the contact layers when it exits the semiconductor layer sequence.

In another advantageous embodiment of the method, the growth substrate is thinned before bonding to the carrier substrate. The growth substrate can be thinned in particular by mechanical ablation such as grinding. It has proved to be particularly advantageous to thin the growth substrate already before bonding it to the carrier substrate, because the application of mechanical processes such as grinding after bonding to the carrier substrate could lead to damage to the component, for example, to damage to the solder connection between the carrier substrate and the semiconductor layer sequences and/or to the formation of cracks or microcracks in the semiconductor layer sequences. Cracks are micro- and macroscopically visible damages of the semiconductor layer sequences and can lead to defective chips, microcracks are micro- and macroscopically invisible damages within the semiconductor layers, which lead to increased aging of the later chips.

If, on the other hand, the growth substrate is thinned before the carrier substrate is bonded to the semiconductor layer sequences, it is advantageous that after bonding to the carrier substrate, only the remaining part of the growth substrate has to be removed. The remaining part of the growth substrate is preferably removed by means of an etching process which does not cause any significant mechanical stress. When thinning the growth substrate by mechanical ablation prior to bonding to the carrier substrate, the semiconductor layer sequences may be bonded to an auxiliary carrier such as a foil on a side opposite the growth substrate, whereby the auxiliary carrier is removed again after thinning.

The remaining thickness of the growth substrate after thinning is preferably not more than 260 µm. This has the advantage that after bonding with the carrier substrate, only a comparatively small thickness needs to be removed by an etching process, for example. The process time required for the etching process is advantageously reduced by prior mechanical thinning.

Further advantageous configurations of the method result from the description of the luminescence diode and vice versa.

BRIEF DESCRIPTION OF THE DRAWINGS

In the following, the invention will be explained in more detail by means of examples in connection with FIGS. 1 to 17.

In the figures:

FIGS. 1 to 16 show schematic representations of an example of the method for producing the luminescence diode using intermediate steps.

Identical or similar elements are represented in the figures with the same reference signs. The represented elements as well as the proportions of the elements among each other are not to be regarded as true to scale.

DETAILED DESCRIPTION OF ILLUSTRATIVE EMBODIMENTS

Figure 1:
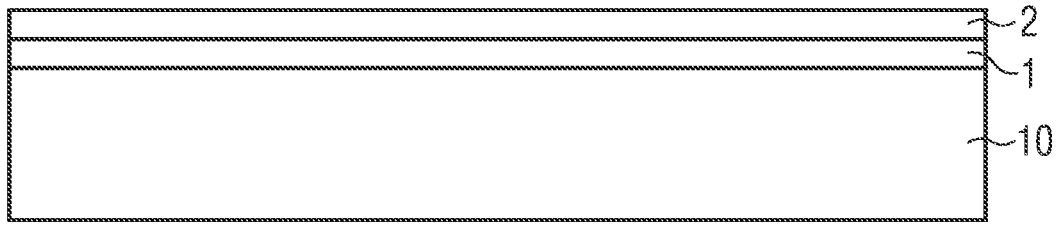

FIG. 1 schematically shows an intermediate step in an example of the method for producing a luminescent diode in which a first semiconductor layer sequence 1 and a second semiconductor layer sequence 2 have been grown on a growth substrate 10. The first semiconductor layer sequence 1 and the second semiconductor layer sequence 2 may each be based on an arsenide compound semiconductor. "Based on an arsenide compound semiconductor" in this context means that the active epitaxy layer sequence or at least one layer thereof comprises an arsenide compound semiconductor material, preferably $Al_nGa_mIn_{1-n-m}As$, where $0 \leq n \leq 1$, $0 \leq m \leq 1$ and $n+m \leq 1$. This material does not necessarily have to have a mathematically exact composition according to the above formula. Rather, it may contain one or more dopants and additional constituents. For simplicity's sake, however, the above formula contains only the essential components of the crystal lattice (Al, Ga, In, As), even if these may be partially replaced by small amounts of other substances.

The semiconductor layer sequences 1, 2 are particularly epitaxially grown on the growth substrate 10, whereby the growth substrate 10 preferably contains GaAs.

The first semiconductor layer sequence 1 and the second semiconductor layer sequence 2 each have several sublayers. Furthermore, an etch stop layer is preferably arranged between the first semiconductor layer sequence 1 and the second semiconductor layer sequence 2. To simplify matters, the sublayers of the semiconductor layer sequences 1, 2 and the etch stop layer are not shown in detail in FIG. 1 and the following FIGS. 3 to 17.

Various examples of the layer stack of the first semiconductor layer sequence 1 and the second semiconductor layer sequence 2 are shown in FIGS. 2A to 2D. In the example shown in FIG. 2A, the first semiconductor layer sequence 1 has starting from the growth substrate an n-type semiconductor region 3a, a first active layer 4a, and a p-type semiconductor region 5a. The second semiconductor layer sequence 2 above has an n-type semiconductor region 3b, a second active layer 4b, and a p-type semiconductor region 5b. The n-type semiconductor regions 3a, 3b and the p-type semiconductor regions 5a, 5b may each be composed of several sublayers and do not necessarily have to consist exclusively of n-doped layers or p-doped layers, but may, for example, also have one or more undoped layers.

The active layers 4a, 4b, which are preferably each based on an arsenide compound semiconductor material, are preferably suitable for the emission of radiation in the infrared spectral range. For example, the first active layer 4a may have a dominant wavelength $\lambda_{dom1}$ and the second active layer 4b may have a dominant wavelength $\lambda_{dom2}$, where the dominant wavelengths $\lambda_{dom1}$ and $\lambda_{dom2}$ are in the wavelength range between 780 nm and 1100 nm and $\lambda_{dom1}$ and $\lambda_{dom2}$ are different from each other.

An etch stop layer 6, preferably comprising a phosphide compound semiconductor material, is arranged on the first semiconductor layer sequence 1. The etch stop layer 6 may in particular comprise $In_xAl_yGa_{1-x-y}P$, where $0 \leq x \leq 1$, $0 \leq y \leq 1$ and $x+y \leq 1$. Preferably, the etch stop layer comprises 6 $In_xGa_{1-x}P$ with $0 \leq x \leq 1$.

In the example shown in FIG. 2A, the n-type semiconductor regions 3a, 3b of both semiconductor layer sequences 1 and 2 face the growth substrate. Alternatively, the p-type semiconductor regions 5a, 5b may face the growth substrate as shown in FIG. 2B.

Alternatively, it is also possible that the semiconductor layer sequences 1, 2 are arranged one above the other with opposite polarity. For example, in the example shown in FIG. 2C, the n-type semiconductor region 3a of the first semiconductor layer sequence 1 and the p-type semiconductor region 5b of the second semiconductor layer sequence 2 face the growth substrate, and in the example shown in FIG. 2D, the p-type semiconductor region 5a of the first semiconductor layer sequence 1 and the n-type semiconductor region 3b of the second semiconductor layer sequence 2 face the growth substrate.

Figure 3:
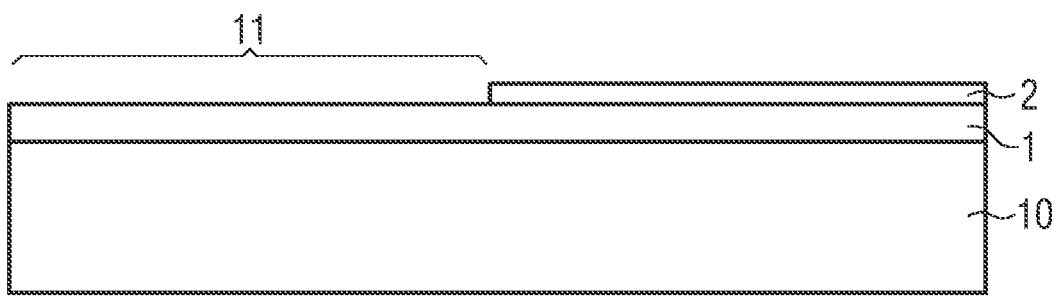

FIG. 3 shows a next intermediate step in the example of the method, whereby here and in the following figures the sublayers of the semiconductor layer sequence 1, 2 and the etch stop layer are again not shown for simplification. In the intermediate step shown here, the second semiconductor layer sequence 2 was removed in a first region 11, for example, by photolithographic application of a mask and a subsequent etching process. In the etching process, the etch stop layer preferably arranged between the semiconductor layer sequences 1, 2 serves as a stop layer and prevents the first semiconductor layer sequence 1 from being attacked during the etching process. The etch stop layer exposed in the first region 11 after partial removal of the second semiconductor layer sequence 2 is preferably subsequently removed selectively to the semiconductor layer sequences in a separate etching step. For example, the first region 11 may have an area between 30% and 70%, preferably between 40% and 60%, of the total area of the first semiconductor layer sequence 1. By adjusting the area proportions, the proportion of the emitted wavelengths in the total emitted radiation can advantageously be adjusted in a targeted manner.

Figure 4:
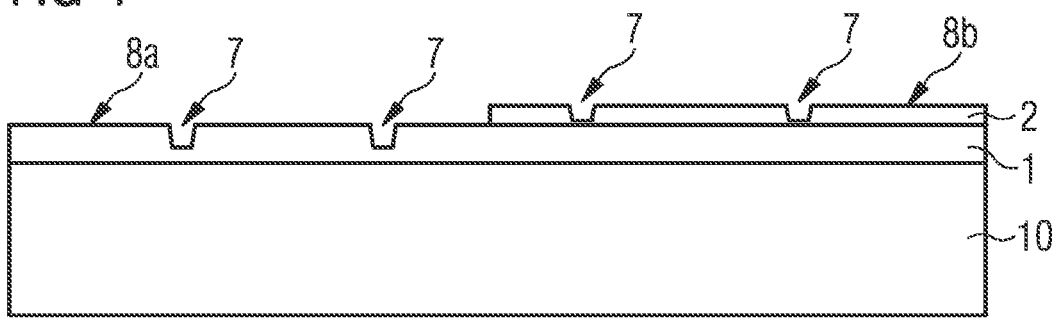

In a subsequent intermediate step schematically shown in FIG. 4, an arrangement of microprisms 7 has been advantageously formed in the first semiconductor layer sequence 1 and the second semiconductor layer sequence 2. The microprisms 7 each extend from a surface 8a, 8b of the semiconductor layer sequences 1, 2 facing away from the growth substrate 10 into the semiconductor layer sequences 1, 2. It is advantageous here if the microprisms 7 have a cross-section which decreases in size starting from the surfaces 8a, 8b facing away from the growth substrate 10. In the finished luminescence diode, the microprisms 7 serve in particular to improve the radiation decoupling and the homogeneity of the emitted radiation.

Figure 5:
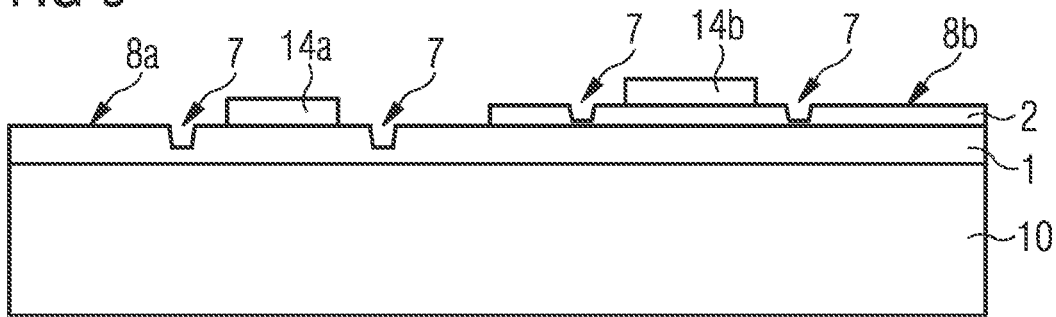

In a further intermediate step shown schematically in FIG. 5, contact metallizations 14a, 14b have been applied to the semiconductor layer sequences 1, 2 in regions. The contact metallizations 14a, 14b are used to establish an electrical contact to the adjacent semiconductor regions of the semiconductor layer sequences 1, 2.

Figure 6:
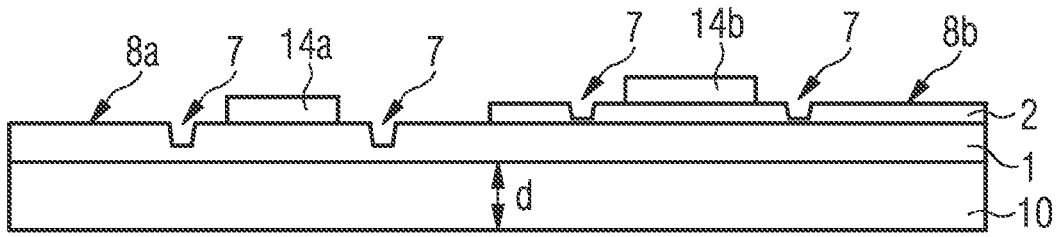

In a preferred variant of the method, the growth substrate 10 is thinned in an intermediate step, shown in FIG. 6, before it is removed from the first semiconductor layer sequence 1 in a later method step. Thinning of the growth substrate 10 is preferably carried out by mechanical processing, e.g., grinding. In this intermediate step, the thickness of the growth substrate 10 is preferably reduced to a thickness $d \leq 260$ µm.

Figure 7:
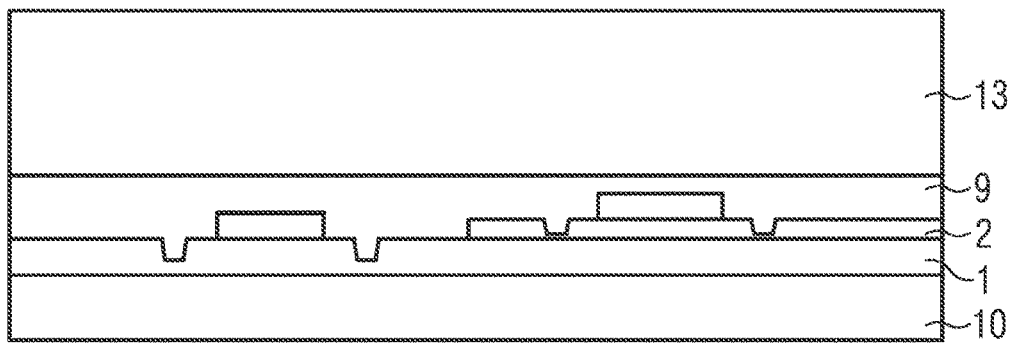

In another intermediate step shown schematically in FIG. 7, the semiconductor layer sequences 1, 2 have been bonded to a carrier substrate 13 on a side facing away from the growth substrate 10 by means of a bonding layer 9, such as a solder layer. The height difference between the region in which the second semiconductor layer sequence was removed and the region which still has both semiconductor layer sequences can be advantageously compensated by the solder layer 9. The solder layer 9 preferably contains AuSn, NiSn, AuIn, InSn, AuInSn.

The carrier substrate 13 may, for example, contain a semiconductor material such as germanium or silicon, or alternatively a metal or a metal alloy. The carrier substrate 13 is preferably electrically conductive.

Figure 8:
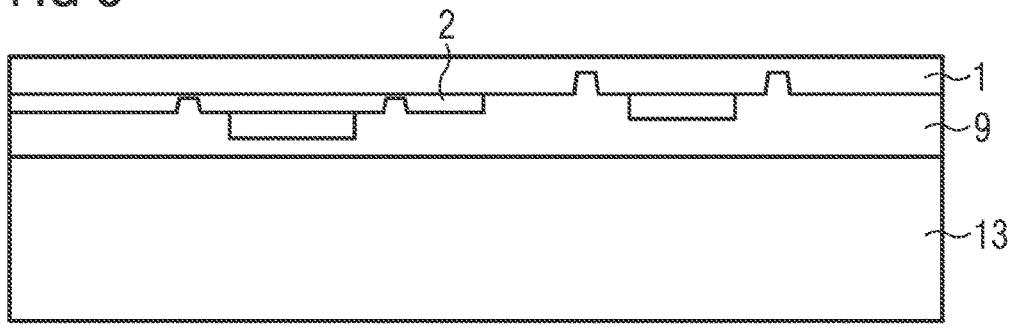

The growth substrate 10 is subsequently completely removed as shown in FIG. 8. The semiconductor layer sequences 1, 2 are now shown rotated by 180°, since the carrier substrate 13 functions as carrier. The removal of the growth substrate 10 can be done by means of an etching process. This has the advantage that, compared to mechanical processes such as grinding, no large mechanical forces act on the soldered joint. In order to reduce the process time during the etching process, it is advantageous if the growth substrate has already been mechanically thinned before the solder layer 9 is produced, as in the intermediate step shown in FIG. 6.

Figure 9:
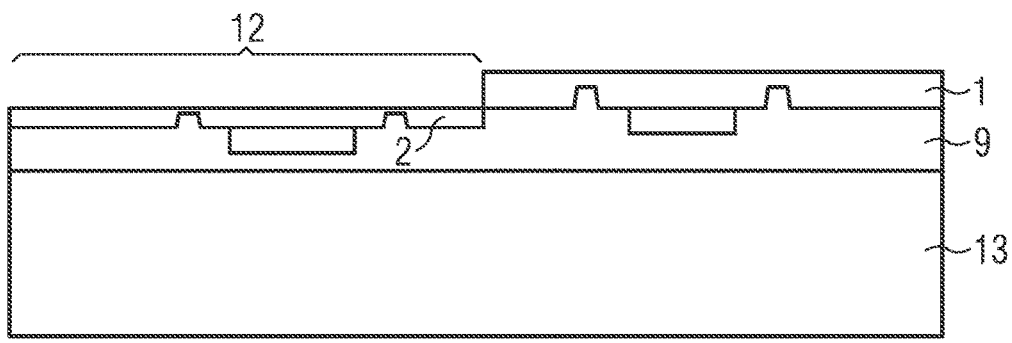

In another intermediate step shown in FIG. 9, the first semiconductor layer sequence 1 in a second region 12 was removed from the second semiconductor layer sequence 2. This is done, for example, like the previous partial removal of the second semiconductor layer sequence 2 by a photolithographic process, whereby the etching process is advantageously stopped by an etch stop layer contained between the first semiconductor layer sequence 1 and the second semiconductor layer sequence 2. The etch stop layer exposed in the second region 12 after partial removal of the first semiconductor layer sequence 1 is preferably subsequently removed selectively to the semiconductor layer sequences in a separate etching step.

Figure 10:
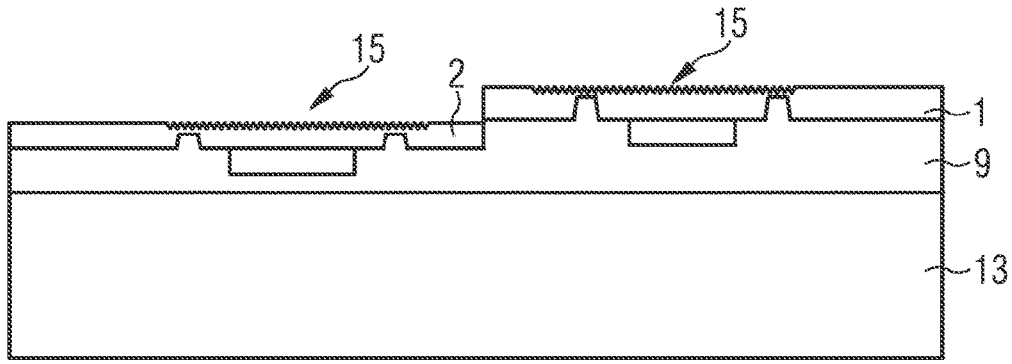

In a further intermediate step shown schematically in FIG. 10, the first semiconductor layer sequence 1 and the second semiconductor layer sequence 2 can be provided at least regionally with a roughening 15, so that the radiation decoupling in the luminescent diode is improved.

Figure 11:
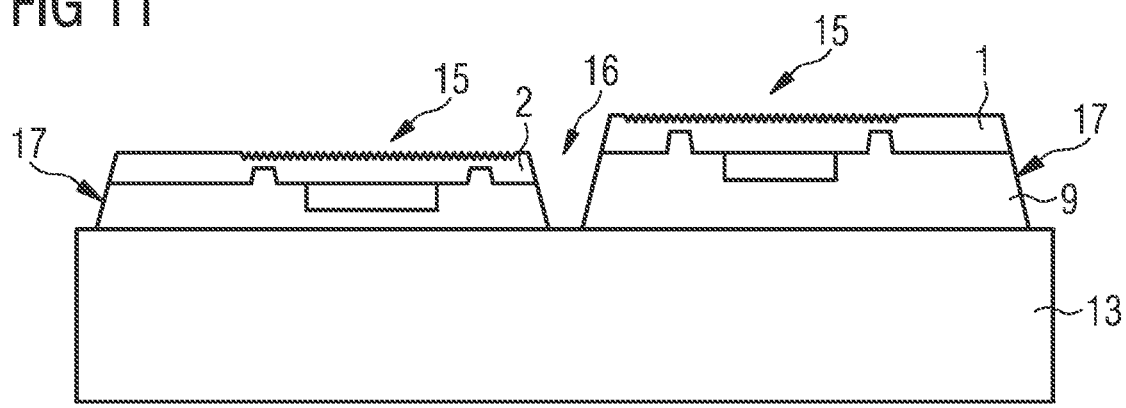

In an intermediate step schematically shown in FIG. 11, for example, a mesa structure in the first semiconductor layer sequence 1 and the second semiconductor layer sequence 2 has been produced in each case by an etching process, whereby the semiconductor layer sequences 1, 2 have been separated from one another in particular in the lateral direction. In particular, a mesa trench 16 has been formed between the semiconductor layer sequences 1, 2. Furthermore, mesa flanks 17 have been formed on the outer sides of the semiconductor layer sequences 1, 2. As an alternative to the mesa trench 16 shown, which can extend up to the carrier substrate, it is also possible to separate only the two semiconductor layer sequences 1, 2 from each other. A gap of a few µm width, for example, less than 10 µm width, between the semi-conductor layer sequences 1, 2 may be sufficient.

Figure 12:
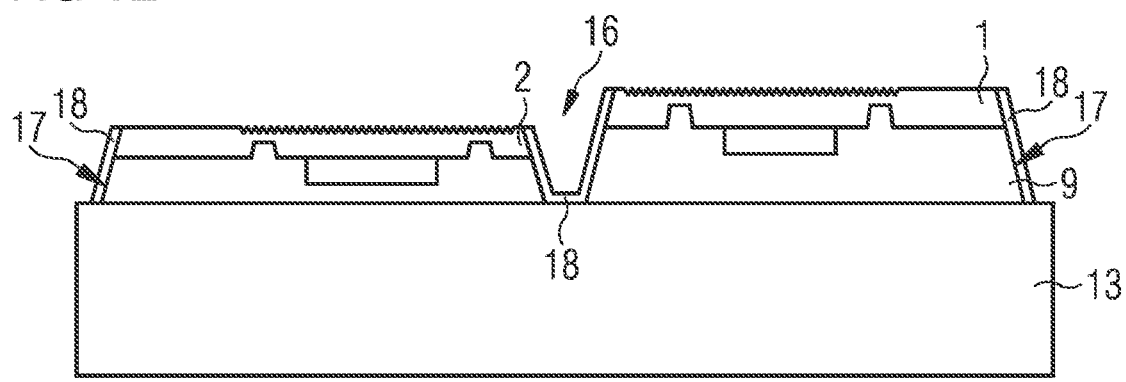

In the intermediate step schematically shown in FIG. 12, mesa trench 16 and mesa flanks 17 are each provided with a passivation layer 18. The passivation layer 18 is preferably a silicon oxide layer or a silicon nitride layer.

Figure 13:
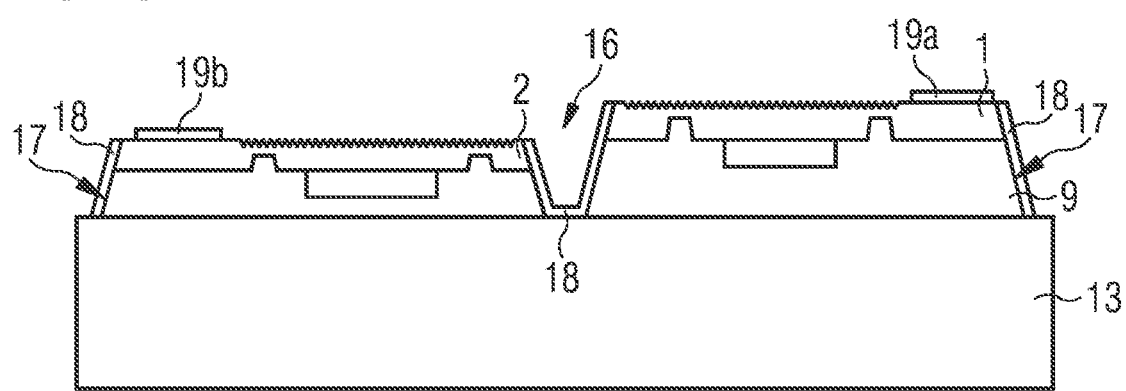

In the further intermediate step of the method shown schematically in FIG. 13, a bond pad 19a, 19b for electrical contacting was applied to the first semiconductor layer sequence 1 and the second semiconductor layer sequence 2. There are different possibilities for the arrangement of the bond pads 19a, 19b on the semiconductor layer sequences 1, 2, some of which are exemplarily shown in the following FIGS. 14A to 14H.

The FIGS. 14A to 14H show the semiconductor layer sequences 1, 2 and the bond pads 19a, 19b, each in a plan view. FIGS. 14A to 14F show various examples of the spatial arrangement of one bond pad 19a on the first semiconductor layer sequence 1 and another bond pad 19b on the second semiconductor layer sequence 2. In the example shown in FIG. 14G, in addition to the bond pads 19a, 19b, contact bars 20 are applied to each of the semiconductor layer sequences 1, 2, which are each connected to the bond pad 19a, 19b. The contact bars 20 can, for example, be arranged in a frame around the radiation exit surfaces of the semiconductor layer sequences 1, 2. In this way, current expansion in particular can be improved.

Figure 14E:
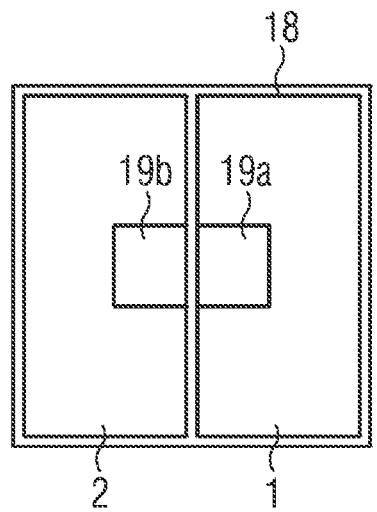
Figure 14F:
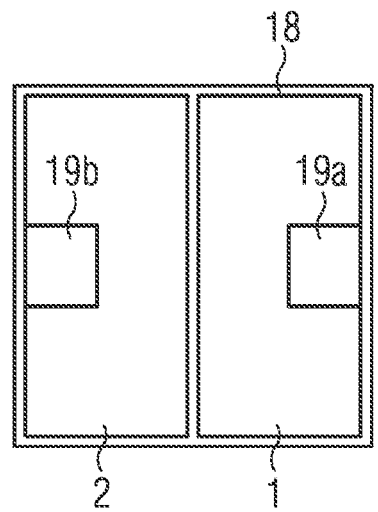
Figure 14G:
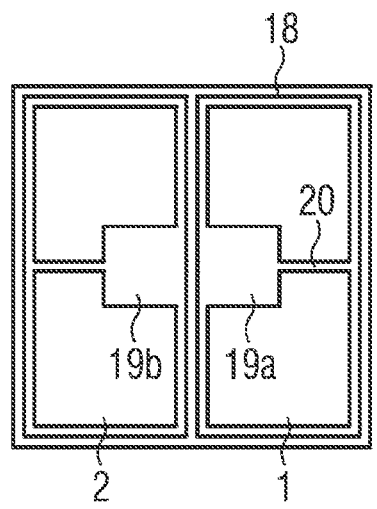
Figure 14H:
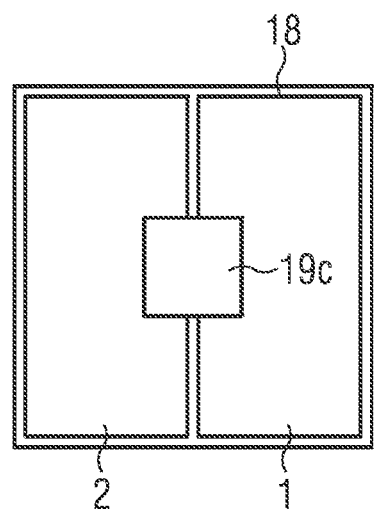

In the example of FIG. 14H, both semiconductor layer sequences 1, 2 are advantageously contacted by a common bond pad 19c. This is particularly advantageous if the semiconductor layer sequences 1, 2 are also contacted together on the opposite side, for example, by solder layer 9 and the preferably electrically conductive carrier substrate 13. In this way, the semiconductor layer sequences 1, 2 can in particular be connected in parallel. In particular, the common bond pad 19c can span an interspace between the semiconductor layer sequences 1, 2. This is shown schematically in the following FIGS. 15 and 16.

Figure 15:
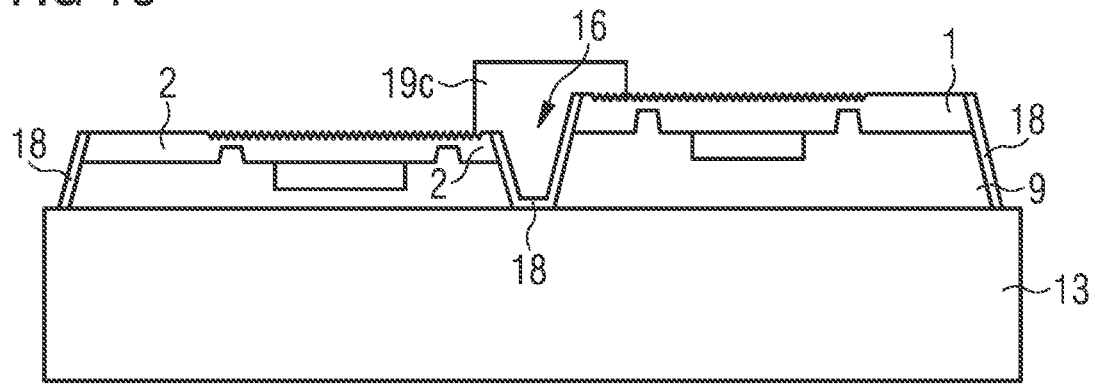

In the example shown in FIG. 15, the electrically conductive material of the common bond pad 19c fills the mesa trench 16 between the semiconductor layer sequences 1, 2 and contacts the semiconductor layer sequences 1, 2 at their tops. To avoid a short circuit, the carrier substrate 13, the solder layer 9 and the side flanks of the semiconductor layer sequences 1, 2 are electrically isolated from the material of the bond pad 19c by the previously applied passivation layer 18.

Figure 16:
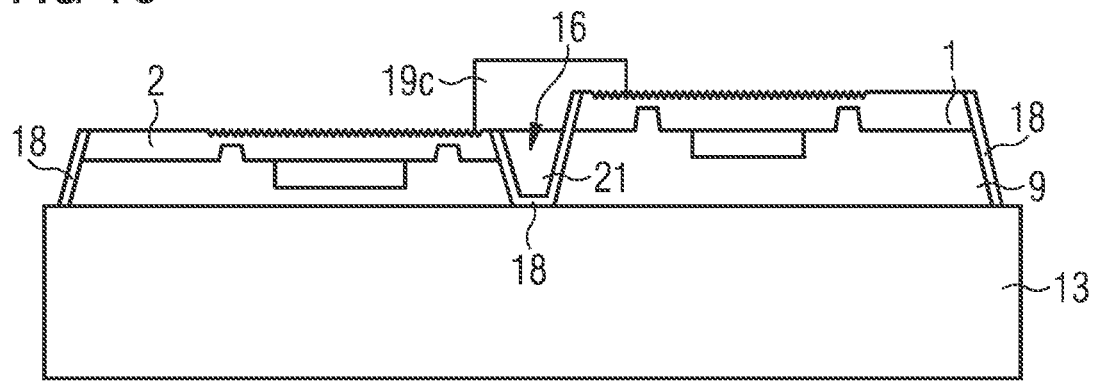

In another advantageous embodiment with a common bond pad 19c, shown in FIG. 16, the mesa trench 16 is filled with a preferably electrically insulating filling layer 21 before the bond pad 19c is applied. This further reduces the risk of a short circuit.

Figure 17:
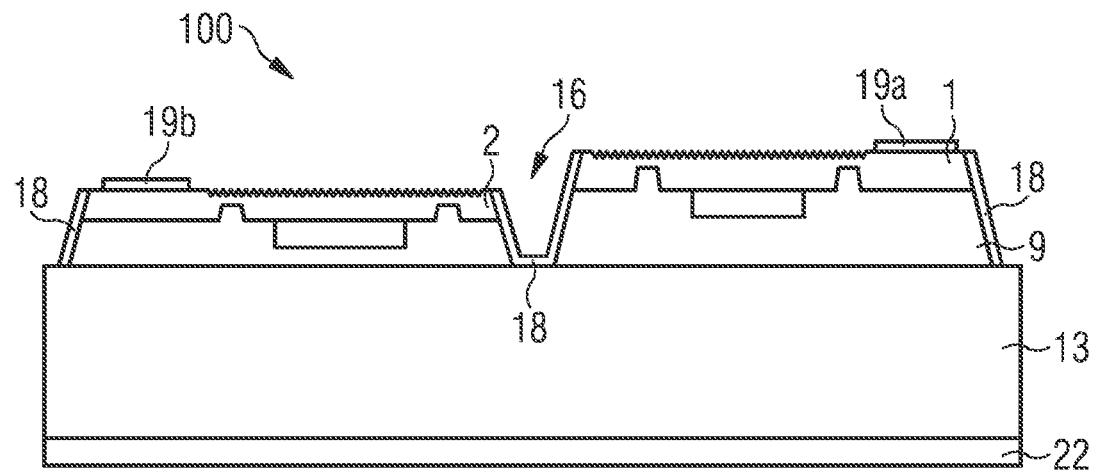
FIG. 17 shows a schematic representation of a cross-section through a luminescence diode according to an example.

To complete the exemplary embodiment of the luminescent diode 100 shown in FIG. 17, at least one further contact layer 22 is subsequently produced for contacting the semiconductor layer sequences 1, 2 on the rear side. For example, a rear side contact 20 can be applied to the rear side of the carrier substrate 13. Here it is possible to apply the additional contact layer 22 over the entire surface or in a structured manner to the rear side of the carrier substrate 13.

The luminescent diode 100 completed in this way has two semiconductor layer sequences 1, 2 arranged side by side on the carrier substrate 13, which are suitable for emitting radiation, in particular in the infrared spectral range between 780 and 1100 nm, the dominant wavelengths of the active layers contained in the semiconductor layer sequences 1, 2 being different from each other. For example, the first semiconductor layer sequence 1 can have a dominant wavelength $\lambda_{dom1}$=850 nm and the second semiconductor layer sequence 2 a dominant wavelength $\lambda_{dom2}$=940 nm. Because the semiconductor layer sequences 1, 2 are arranged side-by-side on the common carrier substrate 13, the distance between the emission points is comparatively small compared to separately manufactured luminescent diodes arranged side-by-side. In the far field, a broadband emission spectrum is therefore produced that contains the radiation portions of both active layers in the semiconductor layer sequences 1, 2.

The invention is not restricted to the exemplary embodiments by the description on the basis of exemplary embodiments. Rather, the invention encompasses any new feature and also any combination of features, which in particular comprises any combination of features in the claims and any combination of features in the exemplary embodiments, even if this feature or this combination itself is not explicitly specified in the claims or exemplary embodiments.

The invention claimed is:

1. A luminescence diode comprising:
   a carrier substrate;
   a first semiconductor layer sequence comprising a first active layer configured to emit radiation having a first dominant wavelength $\lambda_{dom1}$; and
   a second semiconductor layer sequence comprising a second active layer configured to emit radiation having a second dominant wavelength $\lambda_{dom2}$,
   wherein the first semiconductor layer sequence and the second semiconductor layer sequence are arranged side by side on the carrier substrate,
   wherein the first dominant wavelength $\lambda_{dom1}$ of the first active layer and the second dominant wavelength $\lambda_{dom2}$ of the second active layer are different from each other,
   wherein the luminescence diode is configured to emit light in an infrared spectral region,
   wherein both the first semiconductor layer sequence and the second semiconductor layer sequence comprise an arrangement of microprisms,
   wherein the microprisms extend into a surface of the first semiconductor layer sequence facing the carrier substrate and into a surface of the second semiconductor layer sequence facing the carrier substrate, and
   wherein a width of the microprisms decreases with an increasing distance from the carrier substrate in a cross-sectional view of the luminescence diode.

2. The luminescence diode according to claim 1, wherein the first active layer and the second active layer each comprise an arsenide compound semiconductor material.

3. The luminescence diode according to claim 1, wherein the first semiconductor layer sequence and the second semiconductor layer sequence are vertically offset from each other so as to have different vertical distances from the carrier substrate, and wherein the first semiconductor layer sequence and the second semiconductor layer sequence are connected to the carrier substrate by a solder layer which compensates for the different vertical distances.

4. The luminescence diode according to claim 1, wherein the first semiconductor layer sequence and the second semiconductor layer sequence are electrically interconnected by a solder layer.

5. The luminescence diode according to claim 1, wherein the first semiconductor layer sequence and the second semiconductor layer sequence are electrically contacted by a common bonding pad.

6. The luminescence diode according to claim 5, and wherein the common bonding pad spans an intermediate space between the first and second semiconductor layer sequences.

7. The luminescence diode according to claim 1, wherein the first semiconductor layer sequence and the second semiconductor layer sequence are connected in parallel.

8. The luminescence diode according to claim 1, wherein the surface of the first semiconductor layer sequence facing the carrier substrate and the surface of the second semiconductor layer sequence facing the carrier substrate have different vertical distances from the carrier substrate.

* * * * *